United States Patent
Lai

(10) Patent No.: US 7,439,589 B2
(45) Date of Patent: Oct. 21, 2008

(54) ACTIVE MATRIX SUBSTRATE AND REPAIRING METHOD THEREOF

(75) Inventor: Han-Chung Lai, Taoyuan Hsien (TW)

(73) Assignee: Au Optronics Corporation, Hsinchu (TW)

( * ) Notice: Subject to any disclaimer, the term of this patent is extended or adjusted under 35 U.S.C. 154(b) by 218 days.

(21) Appl. No.: 11/307,879

(22) Filed: Feb. 26, 2006

(65) Prior Publication Data

US 2007/0029615 A1  Feb. 8, 2007

(30) Foreign Application Priority Data

Aug. 8, 2005  (TW)  .............................. 94126671 A

(51) Int. Cl.
*H01L 23/62* (2006.01)
(52) U.S. Cl. .............................. 257/355; 257/E33.064
(58) Field of Classification Search .................. 257/355, 257/360, E33.064; 349/38
See application file for complete search history.

(56) References Cited

U.S. PATENT DOCUMENTS 6,812,908 B2  11/2004  Lim ............................. 345/87

7,250,991 B2 * 7/2007 Nagata et al. .................. 349/38

FOREIGN PATENT DOCUMENTS

| JP | 9-244048 | 9/1997 |
|---|---|---|
| JP | 2000-171774 | 6/2000 |
| JP | 2005-115049 | 4/2005 |

* cited by examiner

*Primary Examiner*—Howard Weiss
*Assistant Examiner*—Hoa B Trinh
(74) *Attorney, Agent, or Firm*—Jianq Chyun IP Office

(57) ABSTRACT

An active matrix substrate including a substrate, a plurality of pixel units, a plurality of driving lines, an electron static discharge (ESD) protection circuit and a floating line is provided. The substrate has an active region and a peripheral region connected with the active region. The pixel units are arranged in a matrix in the active region. The driving lines electrically connected to the pixels are disposed in the active region and the peripheral region. The ESD protection circuit and the floating line are disposed in the peripheral region of the substrate. The ESD protection circuit is electrically connected to the driving lines. The ESD protection circuit includes an outer short ring (OSR) and an inner short ring (ISR) disposed between the pixel units and the OSR. The floating line is located beside the outer driving line.

9 Claims, 2 Drawing Sheets

ACTIVE MATRIX SUBSTRATE AND REPAIRING METHOD THEREOF

CROSS-REFERENCE TO RELATED APPLICATION

This application claims the priority benefit of Taiwan application serial no. 94126671, filed on Aug. 8, 2005. All disclosure of the Taiwan application is incorporated herein by reference.

BACKGROUND OF THE INVENTION

1. Field of the Invention

The present invention relates to an active matrix substrate and a method for repairing the same, and more particularly, to an active matrix substrate in which the damage caused by the electron static discharge (ESD) effect can be repaired and a method for repairing the same.

2. Description of the Related Art

The electron static discharge (ESD) phenomenon is very common in our daily life. Basically, since the affinity of electron to objects is different from one another, when two objects are touched and then detached from each other, the electronic charge on the first object is moved to the second object which causes the accumulation of the electron static. Once the electron static is accumulated to a certain level, in case the object with electron static touches or approaches to another object with a different potential, an instant charge transfer phenomenon occurs on both objects, this is the so-called "electron static discharge" (ESD).

Specifically, it is very possible that the electronic products will suffer from the ESD damage during the processes of manufacturing, production, assembly, delivery and even during the normal use by a user. Accordingly, an electron static discharge (ESD) protection design is mandatory for electronic products in order to effectively extend the lifespan of the products, especially for the products that are fabricated by the advanced semiconductor fabricating process, such as the integrated circuit (IC) and the panel display. Since the size of its assembled components is very small, once the element suffers from an instant high voltage electron static discharge, the conductive line inside the IC or the panel display will be damaged permanently by the electron static discharge effect, which makes the element fail to function properly.

Currently, it is common that a dot defect or a line defect is caused by the ESD effect on the panel display. Since the ESD effect cannot be totally eliminated during the manufacturing process of the panel display, an electron static discharge (ESD) protection circuit is commonly configured in the panel display to avoid generating any damage by the ESD effect in the conventional technique. For the current panel display, the most popular ESD protection circuit is composed of an inner short ring (ISR) and an outer short ring (OSR). However, a data line adjacent to the first conductive line or to the last conductive line is not effectively protected by the ISR and the OSR mentioned above. Accordingly, it is common that the data line adjacent to the first conductive line or the last conductive line is easily damaged by the ESD effect, which further causes the line defect.

SUMMARY OF THE INVENTION

Therefore, it is an object of the present invention to provide an active matrix substrate, which comprises a floating line disposed adjacent to an outer inner line.

It is another object of the present invention to provide a method for repairing the aforesaid active matrix substrate when it is damaged.

In order to achieve the objects mentioned above and others, the present invention provides an active matrix substrate. The active matrix substrate comprises a substrate, a plurality of pixel units, a plurality of driving lines, an electron static discharge (ESD) protection circuit and a floating line. The substrate has an active region and a peripheral region disposed adjacent to the active region. The plurality of pixel units are arranged in a matrix in the active region. The plurality of driving lines are disposed in the active region and the peripheral region and electrically connected to the plurality of pixel units. The ESD protection circuit is disposed in the peripheral region of the substrate and electrically connected to the plurality of driving lines. In addition, the ESD protection circuit comprises an outer short ring (OSR), an inner short ring (ISR) and a plurality of driving lines. The ISR is disposed between the plurality of pixel units and the OSR, and the plurality of driving lines are electrically connected between the OSR and the ISR. The plurality of driving lines electrically connected to the plurality of pixel units are extended to the active region from the ISR. Moreover, the floating line is disposed in the peripheral region and located beside the outer driving line.

In accordance with an embodiment of the present invention, the active matrix substrate further comprises a first redundant line and a second redundant line. The first redundant line and the second redundant line are interleaved with the outer driving line and the floating line, respectively; the first redundant line is electrically isolated from the second redundant line.

In accordance with an embodiment of the present invention, the active matrix substrate further comprises an electron static releasing line that is disposed in the peripheral region of the substrate, and the ESD protection circuit is electrically connected to the electron static releasing line.

In accordance with an embodiment of the present invention, the pixel units comprise a plurality of active elements and a plurality of pixel electrodes. Each of the active elements is electrically connected to a corresponding driving line, and each pixel electrodes is electrically connected to a corresponding active element.

In accordance with an embodiment of the present invention, the OSR comprises a first conductive line and a plurality of first protection elements. The first protection elements are electrically connected with each other via the first conductive line. In addition, the first protection elements may be one or more diodes, one or more thin film transistors (TFTs), or combinations thereof. In addition, the first protection elements has a floating gate such as one or more diodes with a floating gate, one or more thin film transistors with a floating a gate, or combinations thereof.

In accordance with an embodiment of the present invention, the ISR comprises a second conductive line and a plurality of second protection elements. The second protection elements are electrically connected with each other via the second conductive line. In addition, the second protection elements may be one or more diodes, one or more TFTs, or combinations thereof.

The present invention further provides a method for repairing the above active matrix substrate having a floating line. The outer driving line of the active matrix substrate mentioned above is open circuit, two metal conductive lines are formed by laser chemical vapor deposition (Laser CVD), and the outer driving line is electrically connected to the floating line via the metal conductive lines.

The present invention further provides a method for repairing the above active matrix substrate having a first redundant line and a second redundant line. The outer driving line is open circuit, the repairing method mentioned above applies laser welding, such that the outer driving line is electrically connected to the floating line via the first redundant line and the second redundant line.

In the present invention, a floating line is disposed beside the outer driving circuit on the active matrix substrate. The outer driving circuit is open circuit due to the ESD effect, the floating line is electrically connected to the outer driving line by laser methods, such that the outer driving line is replaced by the floating line to function, and the object of repairing the active matrix substrate is achieved.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

First Embodiment

Figure 1:
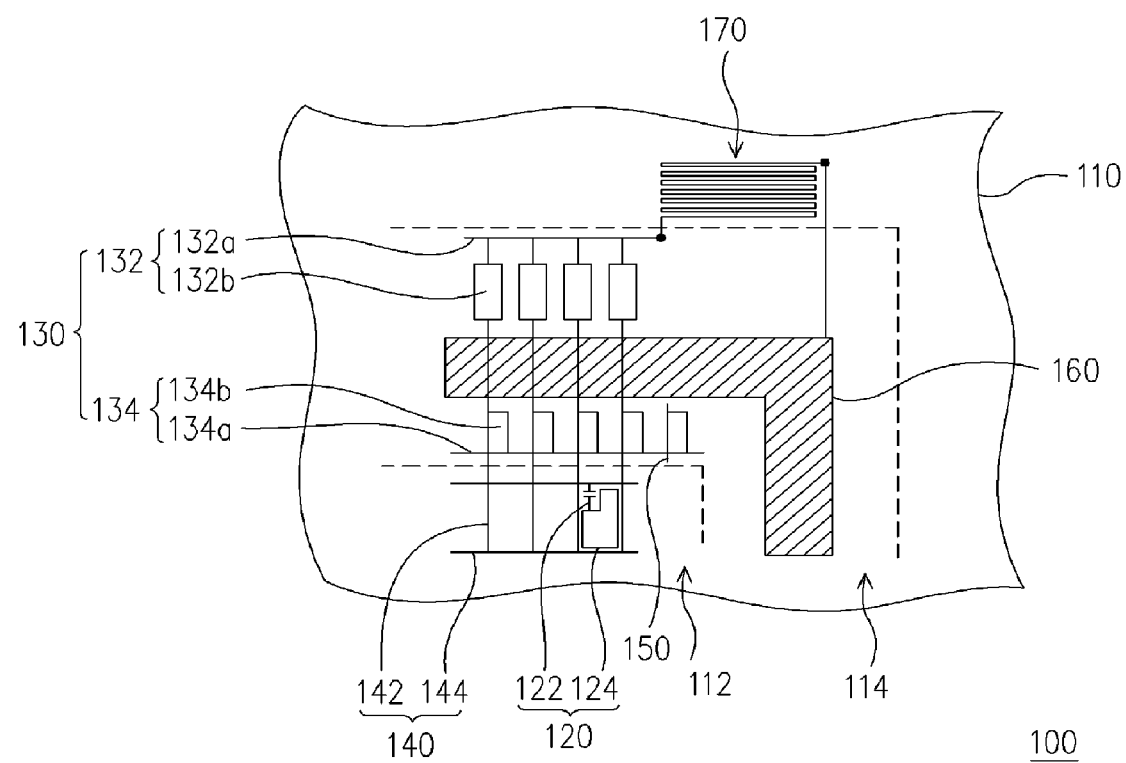
FIG. 1 is a partial schematic view of an active matrix substrate according to a first embodiment of the present invention.

FIG. 1 is a partial schematic view of an active matrix substrate according to a first embodiment of the present invention. Referring to FIG. 1, the active matrix substrate 100 comprises a substrate 110, a plurality of pixel units 120, an ESD protection circuit 130, a plurality of driving lines 140 and a floating line 150. The substrate 110 has an active region 112 and a peripheral region 114 adjacent to the active region 112. The pixel units 120 are arranged in a matrix on the substrate 110. The ESD protection circuit 130, the driving lines 140, and the floating line 150 are all disposed in the peripheral region 114. The ESD protection circuit 130 and the driving lines 140 are electrically connected to the pixel units 120. It is to be noted that the floating line 150 is disposed beside the outer driving line 140.

In the present embodiment, the driving lines 140 in the active region 112 may comprise a data line 142 and a scan line 144 based on its location and characteristic. To be more specific, the outer driving line 140 may be either the first or the last data line 142. Alternatively, the outer driving line 140 may be either the first or the last scan line 144.

In the active matrix substrate 100, each of the pixel units 120 comprises an active element 122 and a pixel electrode 124, and each of the active elements is electrically connected to the corresponding scan line 144 and the data line 142, respectively. In addition, the pixel electrode 124 is electrically connected to the active element 122. Moreover, the ESD protection circuit 130 comprises an OSR 132 and an ISR 134. The ISR 134 is disposed between the OSR 132 and the pixel units 120. The OSR 132 comprises a first conductive line 132a and a first protection element 132b, and the ISR 134 comprises a second conductive line 134a and a second protection element 134b. It is to be noted that the each of the second protection elements 134b is electrically connected to the driving line 140.

In the present embodiment, the substrate 100 may be made of glass, the driving line 140 may be made of metal with good electric conductivity characteristics, the pixel electrode 124 may be made of ITO, IZO, or other transparent electric conductive material, and the active element 122 may be the TFT or other tri-polar active element.

Moreover, the active matrix substrate 100 may further comprise an electron static releasing line 160 and a depleting resistor 170. The depleting resistor 170 and the electron static releasing line 160 are both disposed in the peripheral region 114. The depleting resistor 170 may be formed by a spiral winding circuit and is electrically connected to the first conductive line 142. The electron static releasing line 160 may be a common line that is electrically connected to a common voltage and is electrically connected to the ESD protection circuit 130. In the present embodiment, the first protection element 132b and the second protection element 134b may be the diodes, the TFTs, the capacitors, or combinations thereof, such that the first protection element 132b and the second protection element 134b can conduct electronic charges and also work as switch devices in the ESD protection circuit 130 for forming a charge releasing path.

Figure 2:
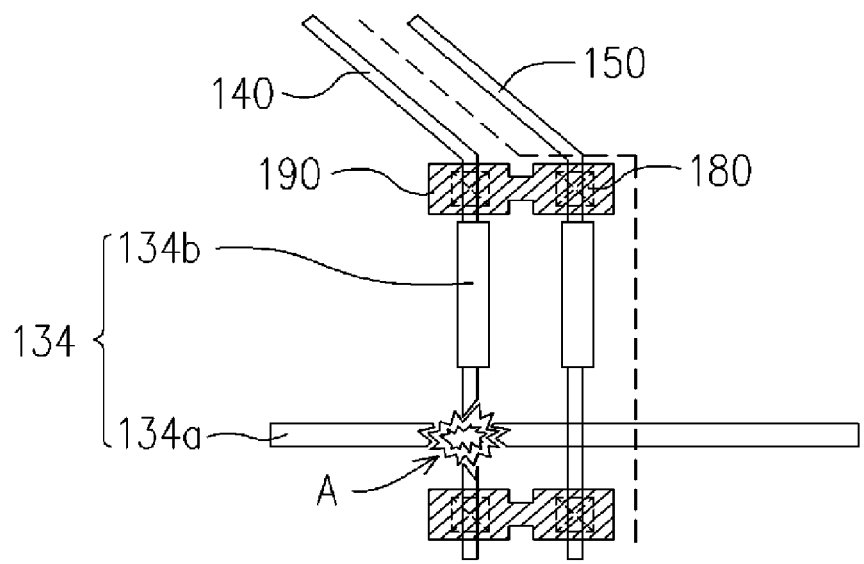
FIG. 2 is a partial magnified schematic view of an active matrix substrate according to a first embodiment of the present invention.

FIG. 2 is a partial magnified schematic view of an active matrix substrate according to a first embodiment of the present invention. Referring to FIG. 1 and FIG. 2, when the active matrix substrate 100 is damaged due to the ESD effect or other factors, the outer driving line 140 (i.e. the outermost scan line 144) is usually broken, as shown at point A of FIG. 2. The open circuit of the driving line 140 causes a line defect on the active matrix substrate 100, which further deteriorates the display quality. Accordingly, in order to repair the line defect of the active matrix substrate 100, the floating line 150 disposed beside the outer driving line 140 can be used to repair the active matrix substrate 100.

To be more specific, in case the outer driving line 140 is open circuit, first a contact window 180 is formed on the floating line 150 and the outer driving line 140, respectively. Then, a layer of metal film 190 is deposited between the floating line 150 and the outer driving line 140, and the metal film 190 is electrically connected to both of the outer driving line 140 and the floating line 150 via the contact window 180. When the outer driving line 140 is electrically connected to the floating line 150 via the metal film 190, the function of the damaged outer driving line 140 is replaced by the floating line 150, such that the object of repairing the active matrix substrate 100 is achieved. In the present invention, the metal film 190 may be deposited by laser chemical vapor deposition (Laser CVD).

Moreover, in order to enhance the function of ESD protection on the active matrix substrate 100 provided by the ESD protection circuit 130 in case the outer driving line 140 is open circuit, the floating line 150 may be further electrically connected to the second protection element 134b in the present embodiment.

Second Embodiment

Figure 3:
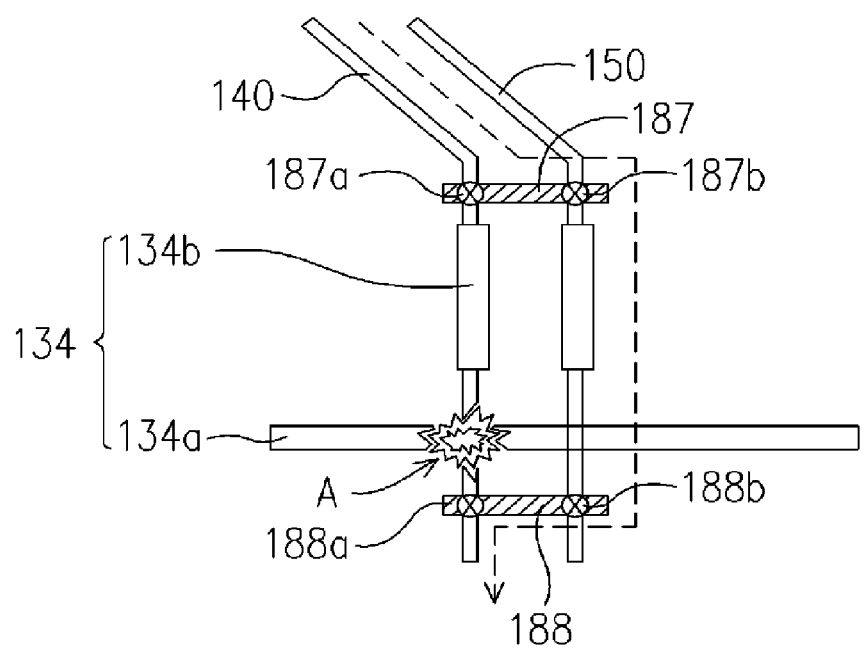
FIG. 3 is a partial magnified schematic view of an active matrix substrate according to a second embodiment of the present invention.

FIG. 3 is a partial magnified schematic view of an active matrix substrate according to a second embodiment of the present invention. Referring to FIG. 1 and FIG. 3, the active matrix substrate 100 of the present embodiment further comprises a first redundant line 187 and a second redundant line 188. The first redundant line 187 and the second redundant line 188 are disposed on both sides of the second conductive line 134a, respectively. In addition, the first redundant line 187 and the second redundant line 188 are interleaved with the outer driving line 140 and the floating line 150. Moreover, the first redundant line 187, the second redundant line 188, the outer driving line 140 and the floating line 150 are electrically isolated from each other.

It is to be noted that the when the line defect is happened in the active matrix substrate 100, four welding points 187a, 187b, 188a and 188b are formed on four intersections of the first redundant line 187, the second redundant line 188, the outer driving line 140 and the floating line 150 respectively by welding, such that the outer driving line 140 is electrically connected to the floating line 150. In the present embodiment, the welding may be laser welding. Since the outer driving line 140 is electrically connected to the floating line 150, the function of the damaged outer driving line 140 is replaced by the floating line 150, and the line defect of the active matrix substrate 100 is repaired.

Moreover, in order to enhance the function of ESD protection on the active matrix substrate 100 provided by the ESD protection circuit 130 in case the outer driving line 140 is open circuit, the floating line 150 may be further electrically connected to the second protection element 134b in the present embodiment.

In summary, with the active matrix substrate and the method for repairing the same provided by the present invention, when the outer driving line is open circuit due to the ESD effect or other factors on the active matrix substrate, the present invention can electrically connect the floating line to the outer driving line, such that the floating line can replace the outer driving line to function, and the active matrix substrate is repaired.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. An active matrix substrate, comprising:
   a substrate having an active region and a peripheral region adjacent to the active region;
   a plurality of pixel units arranged in a matrix in the active region of the substrate; a plurality of driving lines disposed in the active region and the peripheral region and electrically connected to the plurality of pixel units;
   an electron static discharge (ESD) protection circuit disposed in the peripheral region of the substrate and electrically connected to the plurality of driving lines, the ESD protection circuit comprising:
      an outer short ring (OSR); and
      an inner short ring (ISR) disposed between the plurality of pixel units and the OSR; and
   a floating line disposed in the peripheral region and located beside the outer driving line.

2. The active matrix substrate of claim 1, further comprising:
   a first redundant line interleaved with the outer driving line and the floating line; and
   a second redundant line interleaved with the outer driving line and the floating line, wherein the first redundant line is electrically isolated from the second redundant line.

3. The active matrix substrate of claim 1, further comprising an electron static releasing line disposed in the peripheral region of the substrate, wherein the ESD protection circuit is electrically connected to the electron static releasing line.

4. The active matrix substrate of claim 1, wherein the plurality of pixel units comprise:
   a plurality of active elements, each active element being electrically connected to a corresponding driving line; and
   a plurality of pixel electrodes, each pixel electrode being electrically connected to a corresponding active element.

5. The active matrix substrate of claim 1, wherein the OSR comprises:
   a first conductive line; and
   a plurality of first protection elements electrically connected with each other via the first conductive line.

6. The active matrix substrate of claim 5, wherein each of the plurality of first protection elements comprises one or more diodes, one or more thin film transistors (TFTs), one or more capacitors, or combinations thereof.

7. The active matrix substrate of claim 6, wherein each of the plurality of first protection elements has a floating gate.

8. The active matrix substrate of claim 1, wherein the ISR comprises:
   a second conductive line; and
   a plurality of second protection elements electrically connected with each other via the second conductive line.

9. The active matrix substrate of claim 8, wherein each of the plurality of second protection elements comprises one or more diodes, one or more thin film transistors (TFTs), one or more capacitors, or combinations thereof.

* * * * *